(12) United States Patent
Takahata et al.

(10) Patent No.: US 9,941,137 B2
(45) Date of Patent: Apr. 10, 2018

(54) SUBSTRATE PLANARIZING METHOD AND DROPPING AMOUNT CALCULATING METHOD

(71) Applicant: Toshiba Memory Corporation, Minato-ku (JP)

(72) Inventors: Kazuhiro Takahata, Kuwana (JP); Eiichi Soda, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/979,399

(22) Filed: Dec. 27, 2015

(65) Prior Publication Data

US 2016/0351409 A1   Dec. 1, 2016

(30) Foreign Application Priority Data

May 25, 2015   (JP) ................. 2015-105129

(51) Int. Cl.
| | | |
|---|---|---|
| H01L 21/308 | (2006.01) | |
| H01L 21/027 | (2006.01) | |
| H01L 21/3105 | (2006.01) | |
| G03F 7/00 | (2006.01) | |
| H01L 21/302 | (2006.01) | |
| H01L 21/306 | (2006.01) | |
| H01L 21/304 | (2006.01) | |
| G05B 19/402 | (2006.01) | |

(52) U.S. Cl.
CPC ........ H01L 21/3086 (2013.01); G03F 7/0002 (2013.01); H01L 21/0274 (2013.01); H01L 21/302 (2013.01); H01L 21/31058 (2013.01)

(58) Field of Classification Search
None
See application file for complete search history.

(56) References Cited

U.S. PATENT DOCUMENTS

| | | | | |
|---|---|---|---|---|
| 5,736,424 A | * | 4/1998 | Prybyla | ............. H01L 21/31051 257/E21.243 |
| 6,529,188 B1 | * | 3/2003 | Suzuki | ................ G02F 1/13338 345/104 |
| 6,592,443 B1 | * | 7/2003 | Kramer | ................... B24B 37/22 257/E21.23 |
| 6,625,331 B1 | * | 9/2003 | Imaizumi | ................ G06T 5/006 358/1.1 |

(Continued)

FOREIGN PATENT DOCUMENTS

| | | |
|---|---|---|
| JP | 2007-287951 | 11/2007 |
| JP | 2013-111763 | 6/2013 |
| JP | 2013-211450 | 10/2013 |

*Primary Examiner* — Allan Olsen
(74) *Attorney, Agent, or Firm* — Oblon, McClelland, Maier & Neustadt, L.L.P.

(57) ABSTRACT

According to one embodiment, a substrate planarizing method includes dropping from above a substrate with topography, resist whose amount is determined in accordance with the volume of a concave portion according to the topography. The distance between a blank template with a flat pressing plane and the substrate is set to a predetermined distance and then the resist is cured. After that, the blank template is released from the resist and the substrate is entirely etched. The amount of resist to be dropped on the substrate is adjusted for units of shot of the substrate.

4 Claims, 6 Drawing Sheets

(56) References Cited

U.S. PATENT DOCUMENTS

| | | | | |
|---|---|---|---|---|
| 7,360,851 B1* | 4/2008 | Snyder | B41J 3/407 | 347/2 |
| 7,523,701 B2* | 4/2009 | Loopstra | B41M 3/003 | 101/483 |
| 7,802,978 B2* | 9/2010 | Sreenivasan | B29C 43/003 | 425/149 |
| 8,119,052 B2* | 2/2012 | Schumaker | B82Y 10/00 | 264/293 |
| 8,586,126 B2* | 11/2013 | Schumaker | B82Y 10/00 | 427/256 |
| 2003/0124757 A1* | 7/2003 | Lee | B82Y 10/00 | 438/48 |
| 2003/0129542 A1* | 7/2003 | Shih | B81C 1/0046 | 430/311 |
| 2004/0029041 A1* | 2/2004 | Shih | B82Y 10/00 | 430/271.1 |
| 2005/0106321 A1* | 5/2005 | McMackin | B82Y 10/00 | 427/258 |
| 2005/0270312 A1* | 12/2005 | Lad | B41J 3/28 | 347/1 |
| 2005/0276919 A1* | 12/2005 | Truskett | G03F 7/0002 | 427/230 |
| 2006/0001194 A1* | 1/2006 | Cherala | B82Y 10/00 | 264/320 |
| 2008/0158278 A1* | 7/2008 | Inoue | H01L 21/6715 | 347/12 |
| 2009/0183992 A1* | 7/2009 | Fredenberg | B81C 99/0085 | 205/82 |
| 2009/0212012 A1* | 8/2009 | Brooks | B82Y 10/00 | 216/54 |
| 2009/0309253 A1* | 12/2009 | Lin | H01L 21/31058 | 264/101 |
| 2011/0117744 A1* | 5/2011 | Ito | B81C 1/00031 | 438/702 |
| 2013/0310966 A1* | 11/2013 | MacNaughton | G03F 7/70525 | 700/121 |
| 2014/0342030 A1 | 11/2014 | Nakatsuka | | |
| 2016/0351409 A1* | 12/2016 | Takahata | H01L 21/3086 | |
| 2017/0011505 A1* | 1/2017 | Valley | G06T 7/0006 | |

\* cited by examiner

SUBSTRATE PLANARIZING METHOD AND DROPPING AMOUNT CALCULATING METHOD

CROSS-REFERENCE TO RELATED APPLICATIONS

This application is based upon and claims the benefit of priority from Japanese Patent Application No. 2015-105129, filed on May 25, 2015; the entire contents of which are incorporated herein by reference.

FIELD

An embodiment of the present invention relates to a substrate planarizing method and a dropping amount calculating method.

BACKGROUND

The nanoimprinting technique is a technique for transferring a template pattern formed on a surface of a template to a resist on a substrate. The resist is, for example, photo-curable resin such as a UV-curable material.

In the nanoimprinting, the template is pressed against the resist on the substrate and the template pattern is filled with the resist. The resist in the pattern is cured and then the template is released from the substrate. This forms an uneven pattern (recess/protrusion pattern) on the resist on the substrate.

If, however, the substrate has a large step difference (topography), the followability of the template near the step difference is low, in which case the pattern defect may be caused. In addition, if the topography is large, the thickness of the resist (called RLT) between the template and the substrate varies to increase the shearing force of the template. The variation in thickness of RLT has an influence on the alignment. As a result, the overlapping accuracy between the substrate and the imprint pattern is deteriorated. If the step difference of the substrate is large in the light exposure, the focusing position within the shot is different above and below the step difference, in which case the patterning defect is caused.

For planarizing the step difference of the substrate, a planarizing technique such as forming an applied film has been suggested. However, the planarization for the step difference in the nanoscale has been insufficient.

DETAILED DESCRIPTION

According to the embodiment, a substrate planarizing method is provided. In the substrate planarizing method, resist is dropped from above the substrate with a topography, that is a non-planar deviation in a predetermined region, and the amount of resist is determined in accordance with the volume of a concave portion according to the topography. A blank template with a flat pressing plane or the substrate is moved so that the distance between the blank template and the substrate becomes a predetermined distance. This causes the pressing plane of the blank template to be pressed against the resist. Then, the resist is cured. After that, the blank template is released from the resist. Then, the substrate is entirely etched from above the resist. The amount of resist to be dropped onto the substrate is adjusted for units of shot of the substrate.

An exemplary embodiment of a substrate planarizing method and a dropping amount calculating method will be explained below in detail with reference to the accompanying drawings. The present invention is not limited to the following embodiments.

Embodiment

Figure 1A:
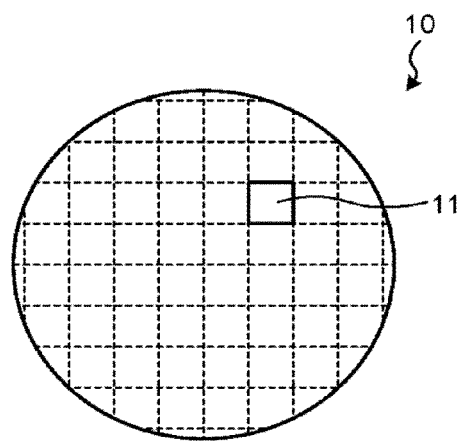
FIGS. 1A and 1B are diagrams for describing the shot position set on a wafer and the unevenness on the wafer surface in the shot.
Figure 1B:
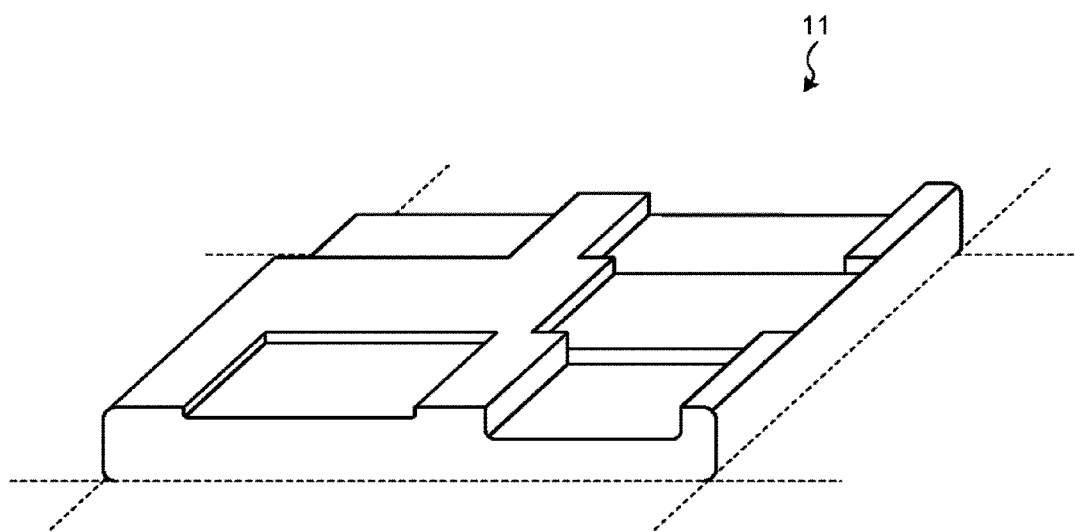

FIGS. 1A and 1B are diagrams for describing the shot position set on a wafer and the unevenness of a wafer surface within the shot. FIG. 1A illustrates a position of a shot 11 set on a wafer 10. FIG. 1B illustrates the unevenness of the wafer surface within the shot 11. Specifically, FIG. 1B illustrates the unevenness of one shot and does not illustrate the unevenness of the surrounding shots.

In the imprinting lithography, the resist is dropped to the wafer 10 with the topography. The resist is cured while the resist is pressed by a blank template (flat substrate). After that, the resist is etched back. This removes the convex portion of the wafer 10 together with the resist, thereby planarizing the wafer 10.

In this embodiment, the amount of resist to be dropped onto the wafer 10 is adjusted for units of shot of the wafer 10. The wafer 10 is a substrate such as a semiconductor wafer (substrate to be transferred), and a semiconductor device is formed on the wafer using the imprinting lithography or the like. On the wafer 10, a plurality of shots 11 is arranged in matrix. On the wafer 10, moreover, the circuit pattern or the like is formed for every shot.

Each of the shots 11 has the topography representing the in-plane planarity on the side (one main plane) to be provided with a semiconductor device (substrate pattern). The topography is the unevenness on the wafer surface with a spatial wavelength component of approximately 0.2 mm to 20 mm and the non-planar deviation in FQA (Fixed Quality Area). The topography includes the dip, bump, wave, and the like on the wafer surface. The dip, bump, wave, and the like have the peaks of the valley height varying in the range of several nanometers to several hundred nanometers. The topography according to this embodiment is the non-planar deviation within a predetermined spatial wavelength range and FQA in a predetermined region (for example, in the shot 11).

The wafer 10 where the semiconductor device is formed has the topography that is different for each process (layer).

Therefore, the wafer 10 is subjected to the planarization process in accordance with the topography of each layer.

For example, the wafer 10 has an M-th topography in an M-th process (M is a natural number). In this embodiment, the resist (imprinting material) is dropped at an M-th dropping position for the M-th topography. On this occasion, the position where the resist is dropped is set in accordance with the position of the convex and concave portion according to the topography. Therefore, in regard to the resist dropping density per unit area, at least two kinds are set on one shot.

In some cases, the topography of the wafer 10 is different for each shot. For this reason, the amount of resist is calculated for each shot (units of shot) on the wafer 10 in this embodiment. The resist is, for example, photo-curable resin such as a UV-curable material. After the resist is dropped and the resist is planarized, the wafer 10 is etched back.

Next, description is made of the planarization process for the wafer 10. The planarization process for the wafer 10 includes a process of dropping resist, a process of pressing a template against the resist, and a process of etching back the resist.

Figure 2:
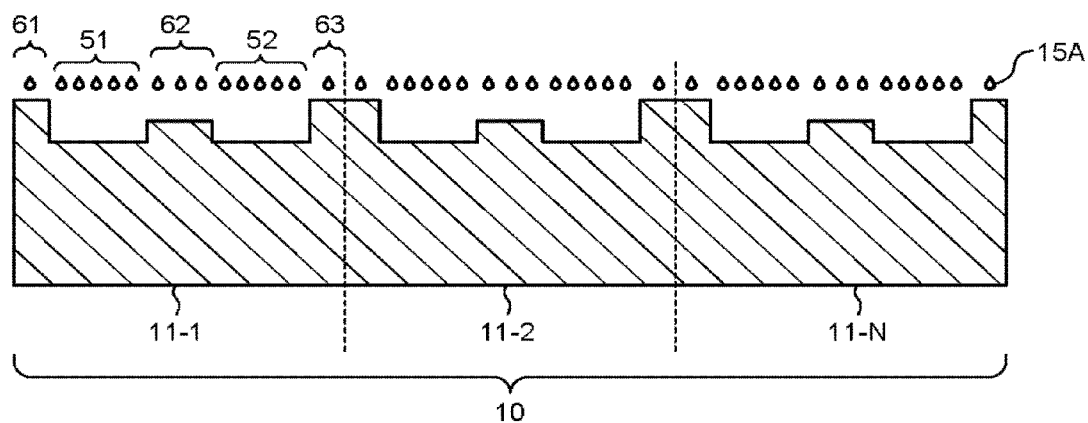
FIG. 2 is a diagram for describing a process of dropping resist according to an embodiment.

FIG. 2 is a diagram for describing the process of dropping the resist according to the embodiment. The resist is dropped to each shot 11 on the wafer 10 by the inkjet method. In FIG. 2, the process of dropping the resist is performed for shots 11-1 to 11-N (N is a natural number).

In the shots 11-1 to 11-N, the resist dropping positions are set similarly. Here, description is made of how to set the resist dropping position for the shot 11-1.

The surface of the shot 11-1 has unevenness (step difference) because of the topography in the shot 11-1. This unevenness is not the uneven pattern (recess/protrusion pattern) of the substrate pattern and not the desired one in the shot. Therefore, the position of dropping resist 15A is set so that the topography (unevenness) in the shot is filled with the resist 15A in a short period of time.

The resist 15A is dropped at the density according to the height of the convex and concave portions in the shot 11-1. For example, the resist 15A is dropped at the higher density as the convex and concave portions are smaller, and the resist 15A is dropped at the lower density as the convex and concave portions are taller. In other words, the amount of dropping the resist 15A is adjusted in accordance with the depth of the convex and concave portions.

For example, in the shot 11-1, the resist 15A is dropped at the lower density than a predetermined value for convex portions 61 to 63. In the shot 11-1, moreover, the resist 15A is dropped at the higher density than the predetermined value for concave portions 51 and 52. In other words, the resist 15A is dropped at the higher density in the concave portions 51 and 52 than in the convex portions 61 to 63.

Specifically, the amount of dropping the resist 15A in the shot 11-1 corresponds to the resist volume of the resist 15A to be deposited in the shot 11-1. The resist volume corresponds to the sum of the volume (step difference volume) formed by the step difference in the shot 11-1 and the volume (upper side volume) of the resist 15A disposed above the step difference.

The upper side volume is calculated by multiplying the area of the shot 11-1 (area of the pressing plane) by the necessary thickness (RLT: residual layer thickness, which is the thickness of the upper side resist). The step difference volume (volume of the concave portion) is calculated based on the area and depth of the concave portion out of the convex and concave portions.

In this embodiment, the resist dropping amount, which is the resist volume, is calculated by adding the step difference volume to the upper side volume. Based on the resist dropping amount and the position and height of the convex and concave portions, the resist dropping position in the shot 11-1 is set.

The resist dropping amount and the resist dropping position are set based on the step difference in the shot 11-1, so that the resist 15A is thick in the concave portions 51 and 52 and thin in the convex portions 61 to 63. As a result, the surface of the resist 15A in the shot 11-1 becomes substantially flat.

Figure 3:
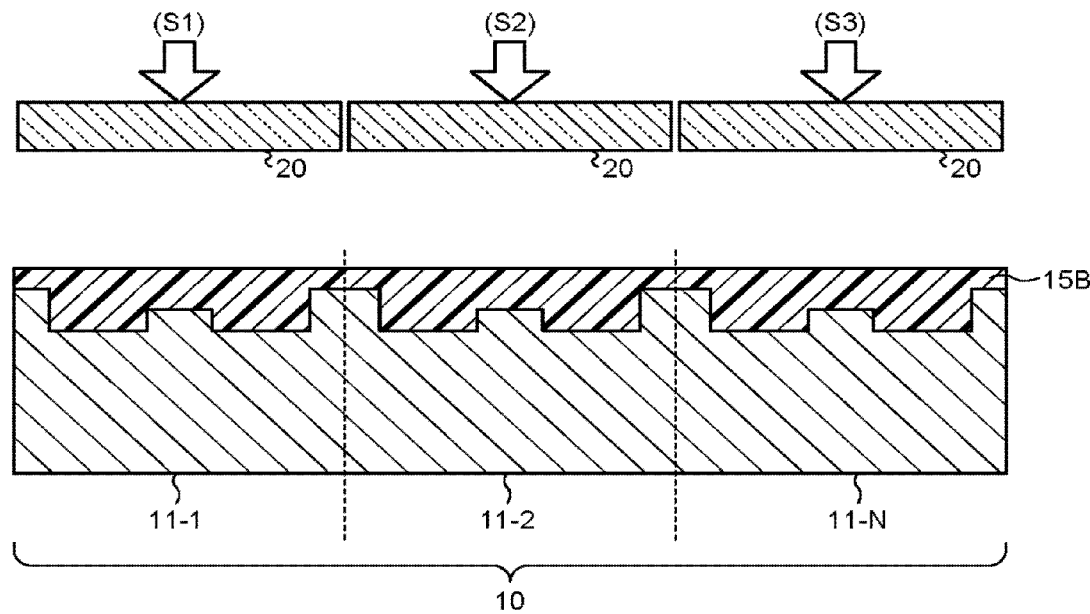
FIG. 3 is a diagram for describing a pressing process according to the embodiment.

FIG. 3 is a diagram for describing the pressing process according to the embodiment. After the resist 15A is dropped in the shots 11-1 to 11-N, a template (blank template) 20 is pressed from above the resist 15A. Specifically, the wafer 10 or the template 20 is moved so that the wafer 10 and the template 20 have a predetermined distance therebetween.

The template 20 according to the embodiment has a flat plane (template pattern plane) on the side to be pressed against the resist 15A. For example, the template 20 has a mesa region with the flat pressing plane.

First, the template 20 is pressed against the resist 15A on the shot 11-1 and then, the wafer 10 and the resist 15A are left in contact for a predetermined period of time. This fills the shot 11-1 with the resist 15A. The upper surface of the resist 15A becomes a flat plane, which is similar to the pressing plane of the template 20.

In this state, the bottom plane (plane opposite to the plane pressed against the resist 15A) side of the template 20 is irradiated with UV light or the like. This cures the resist 15A and the flat plane of the template 20 is patterned to the resist 15A. As a result, the resist 15A turns into a resist 15B with the flat upper surface on the shot 11-1 (S1). After that, the template 20 on the shot 11-1 is released from the resist 15B.

The shot 11-2 is subjected to the pressing process, which is similar to the shot 11-1. Thus, the resist 15A turns into the resist 15B with the flat upper surface on the shot 11-2 (S2). After that, the template 20 on the shot 11-2 is released from the resist 15B.

Moreover, the shot 11-N is subjected to the pressing process, which is similar to the shot 11-1. Thus, the resist 15A turns into the resist 15B with the flat upper surface on the shot 11-N(S3). After that, the template 20 on the shot 11-3 is released from the resist 15B. Through the imprinting process for the shots 11-1 to 11-N, the surface of the resist 15B becomes flat regardless of the topography of the wafer 10.

The description has been made of the case in which the pressing process is performed after the resist 15A is dropped on all the shots. However, the dropping of the resist 15A and the pressing process may alternatively be performed for every shot. In this case, the dropping of the resist 15A and the pressing process are repeated in this order for every shot.

Figure 4A:
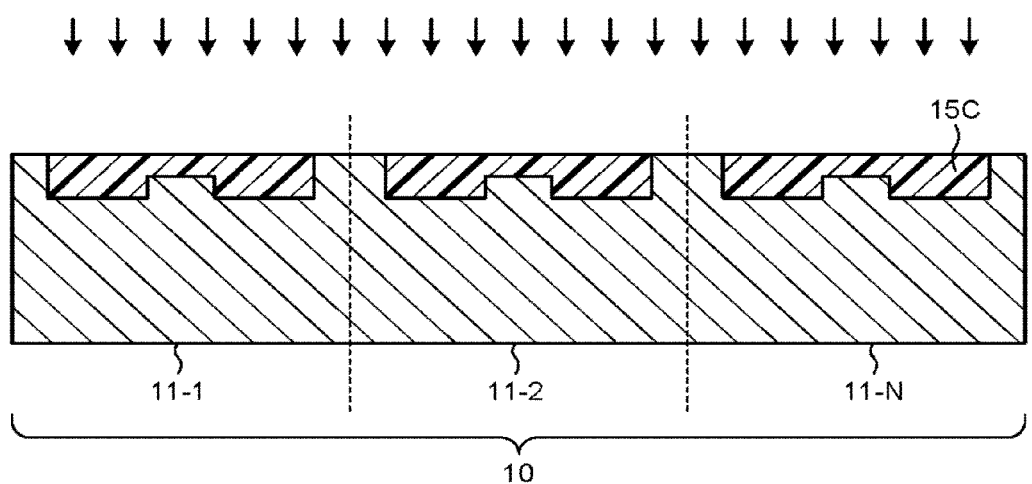
FIGS. 4A and 4B are diagrams for describing an etch-back process according to the embodiment.
Figure 4B:
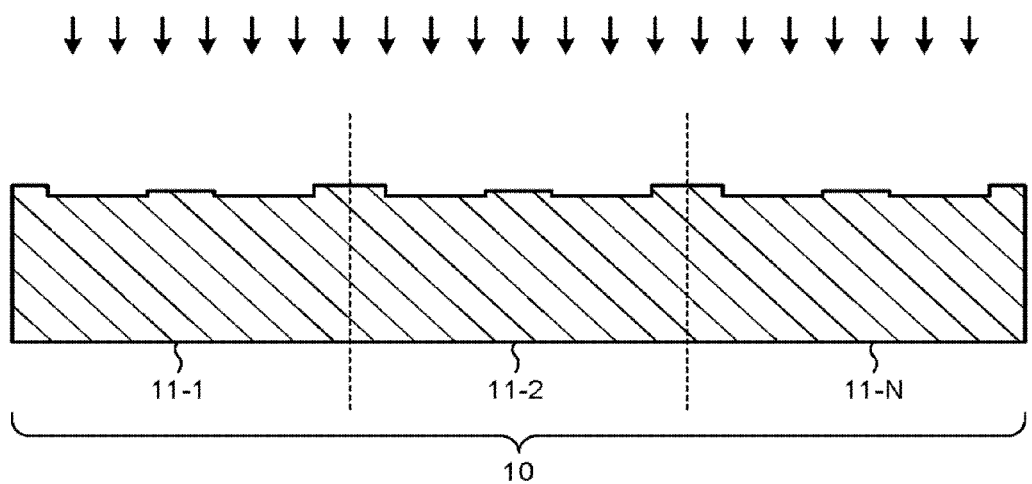

FIGS. 4A and 4B are diagrams for describing the etch-back process according to the embodiment. The etch-back process is performed for the wafer 10 after all the shots 11-1 to 11-N are subjected to the pressing process. The etch-back process is performed for the entire surface of the wafer 10 from above the resist 15B. Thus, the resist 15B is removed until a part of the surface of the wafer 10 is exposed. As a result, as illustrated in FIG. 4A, the resist 15B turns into a resist 15C on the shots 11-1 to 11-N. The resist 15C is the resist embedded in only the concave portions on the wafer 10.

After that, the etch-back process is continued; then, the resist 15C is entirely removed as illustrated in FIG. 4B.

Then, the shots 11-1 to 11-N have substantially the flat surface. As a result, the topography on the wafer 10 is eliminated.

In the etch-back process for the wafer 10, the etching condition is optimized so that the etching selectivity between the resists 15B and 15C and the surface material of the wafer 10 becomes close. For example, the etching selectivity between the resists 15B and 15C and the surface material (film to be etched) of the wafer 10 is 1.5 or less in the etch-back process. This reduces the step difference of the wafer 10 because the convex portion on the wafer 10 is etched together with the resists 15B and 15C. In this embodiment, the wafer 10 is planarized through the process in FIGS. 2 to 4B as described above.

In this embodiment, the resist 15A to be dropped on the wafer 10 is changed for every shot. For example, the wafer 10 may have the topography different for every shot. In view of this, the resist dropping position is set in accordance with the topography for every shot.

Figure 5:
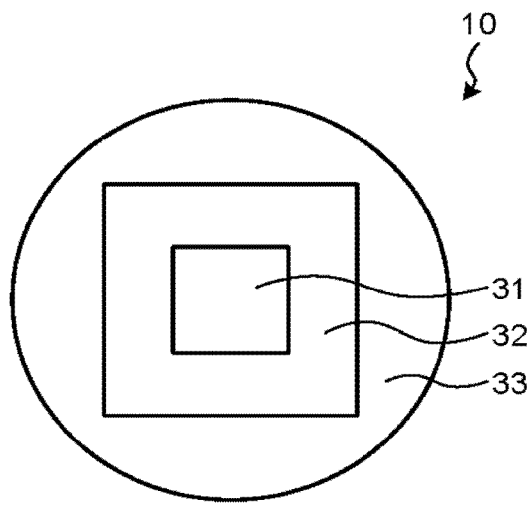
FIG. 5 is a diagram for describing the resist dropping position for each shot.

FIG. 5 is a diagram for describing the resist dropping position for every shot. The wafer 10 has, for example, the topography in accordance with the distance from the center of the wafer 10. In this case, the resist dropping position in accordance with the distance from the center of the wafer 10 is set for each shot.

For example, the shot group disposed in a first region 31 on the wafer 10 has distances 0 to L1 from the center of the wafer 10. In this case, a first resist dropping position is set for the shots disposed in the first region 31.

The shot group disposed in a second region 32 on the wafer 10 has distances L2 to L3 (L1<L3) from the center of the wafer 10. In this case, a second resist dropping position is set for the shots disposed in the second region 32.

The shot group disposed in a third region 33 on the wafer 10 has distances L4 to L5 (L3<L5) from the center of the wafer 10. In this case, a third resist dropping position is set for the shots disposed in the third region 33.

Figure 6:
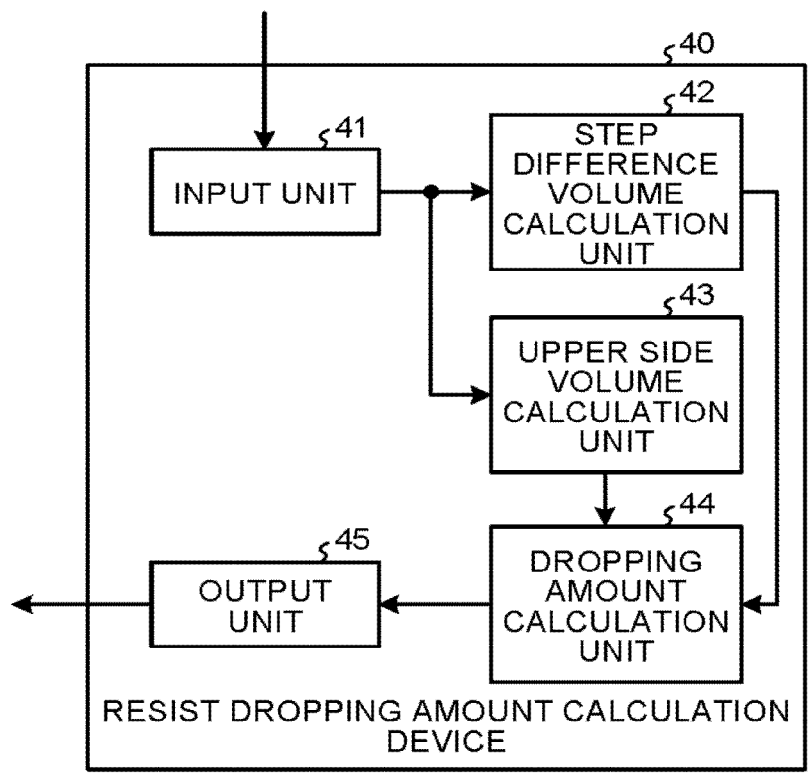
FIG. 6 is a diagram illustrating a structure of a resist dropping amount calculation device according to the embodiment.

FIG. 6 is a diagram illustrating a structure of a resist dropping amount calculation device according to the embodiment. A resist dropping amount calculation device 40 corresponds to, for example, a computer that calculates the amount of resist 15A to be dropped on the wafer 10. The resist dropping amount calculation device 40 according to this embodiment calculates the amount of resist 15A to be dropped on the wafer 10 for every shot.

The resist dropping amount calculation device 40 includes an input unit 41, a step difference volume calculation unit 42, an upper side volume calculation unit 43, a dropping amount calculation unit 44, and an output unit 45. To the input unit 41, the topography information about the topography for every shot and the resist thickness information about the resist thickness (RLT) for every shot of the resist 15A to be formed on the upper side of the topography are input. The input unit 41 sends the topography information to the step difference volume calculation unit 42. The input unit 41 sends the thickness information to the upper side volume calculation unit 43.

Based on the topography information, the step difference volume calculation unit 42 calculates the step difference volume in accordance with the unevenness of the topography. In other words, the step difference volume calculation unit 42 calculates based on the topography information, the volume of the concave portion according to the topography. Here, the step difference volume calculation unit 42 calculates the step difference volume for each shot. The step difference volume calculation unit 42 sends the calculated step difference volume to the dropping amount calculation unit 44.

The upper side volume calculation unit 43 calculates the upper side volume of the resist 15A to be disposed above the convex and concave portions (step difference) of the topography on the basis of the thickness information. The upper side volume calculation unit 43 calculates the upper side volume for each shot. The upper side volume calculation unit 43 sends the calculated upper side volume to the dropping amount calculation unit 44.

The dropping amount calculation unit 44 adds the upper side volume to the step difference volume, thereby calculating the resist dropping amount as the resist volume. The dropping amount calculation unit 44 may calculate the number of drops of the resist 15A as the resist dropping amount. The dropping amount calculation unit 44 sends the calculated resist dropping amount to the output unit 45. The output unit 45 outputs the resist dropping amount to an external device such as an imprinting device.

Figure 7:
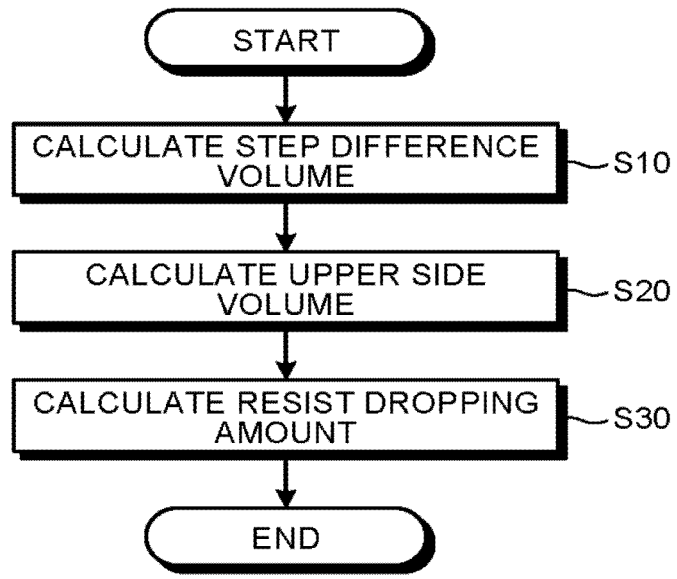
FIG. 7 is a flowchart of the procedure of a process of calculating the resist dropping amount according to the embodiment.

FIG. 7 is a flowchart of the procedure of a process of calculating the resist dropping amount according to the embodiment. The acquired topography information about the topography of the wafer 10 is input to the input unit 41. Moreover, the thickness information is input to the input unit 41.

The step difference volume calculation unit 42 calculates the step difference volume for each shot on the basis of the topography information (Step S10). Specifically, the step difference volume calculation unit 42 calculates the step difference volume on the basis of the depth and area of the concave portion.

The upper side volume calculation unit 43 calculates the upper side volume for each shot on the basis of the thickness information (Step S20). Specifically, the upper side volume calculation unit 43 calculates the upper side volume on the basis of the area of the pressing plane and the thickness of the upper side resist.

For every shot, the dropping amount calculation unit 44 adds the upper side volume to the step difference volume, thereby calculating the resist dropping amount (resist volume) for each shot (Step S30). After that, the output unit 45 outputs the resist dropping amount to the external device such as the imprinting device as necessary.

In this embodiment, the pressing process for the template 20 is performed for each shot; however, the pressing process for the template 20 may alternatively be performed for every plural shots. In this case, the template is formed so that the pressing plane of the template has a size larger than or equal to the region including the plural shots on the wafer 10. In one pressing process, the pressing plane is pressed against the plural shots.

Figure 8:
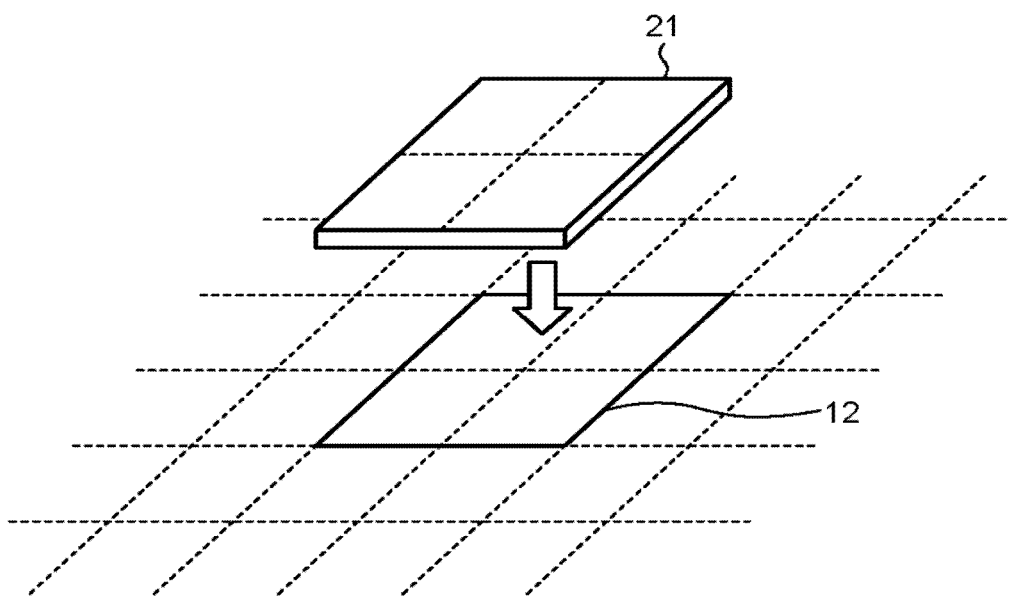
FIG. 8 is a diagram for describing the pressing process for every plural shots.

FIG. 8 is a diagram for describing the pressing process for every plural shots. After the resist 15A is dropped to the region 12 including the plural shots (for example, four shots), a template 21 is pressed from above the resist 15A. Specifically, the wafer 10 or the template 21 is moved so that the distance between the wafer 10 and the template 21 becomes a predetermined distance.

The template 21 has the template pattern plane for four shots. The template pattern plane (pressing plane) of the template 21 is flat. In the pressing process, the resist 15A is dropped to each shot on the region 12. Then, the template 21 is pressed against the resist 15A on the region 12. In other words, in one pressing process, the pressing plane of the template 21 is pressed against the plural shots on the wafer 10, and then the wafer 10 and the resist 15A remain in contact with each other for a predetermined period. This fills all the shots in the region 12 with the resist 15A. Thus, the upper surface of the resist 15A becomes a flat surface similar to the pressing plane of the template 21.

In this state, the bottom plane side of the template 21 is irradiated with UV light or the like. This cures the resist 15A and the flat surface of the template 21 is patterned to the resist 15A. As a result, the resist 15A turns into the resist 15B with the flat upper surface on the shots in the region 12. After that, the template 21 on the region 12 is released from the resist 15B.

On the wafer 10, the pressing process using the template 21 is performed for the next region 12. Through one or a plurality of pressing processes using the template 21, all the shots on the wafer 10 are planarized. The template 21 may have the template pattern plane for three or less shots or five or more shots. The template 21 may have, for example, the template pattern plane with the same size as the entire surface of the wafer 10. In this case, the wafer 10 can be planarized through one pressing process.

The planarizing process for the wafer 10 is performed for each layer of the wafer process, for example. Specifically, the planarizing process as described above is performed for the wafer 10 and then the resist is disposed (dropped or applied) on the wafer 10. Then, the wafer 10 with the resist disposed thereon is subjected to a lithography process using a mask. The lithography process here may be imprinting lithography or other lithography such as photolithography. Here, description is made of the case of the photolithography.

The wafer 10 with the resist applied thereon is exposed to light and then the wafer 10 is developed. Thus, the resist pattern is formed on the wafer 10. Using the resist pattern as a mask, the films below the resist pattern are etched. Thus, the solid pattern corresponding to the resist pattern is formed on the wafer 10. In the manufacture of the semiconductor device (semiconductor integrated circuit), the planarizing process, the exposure, the development, the etching, etc. as described above are repeated for each layer.

Figure 9:
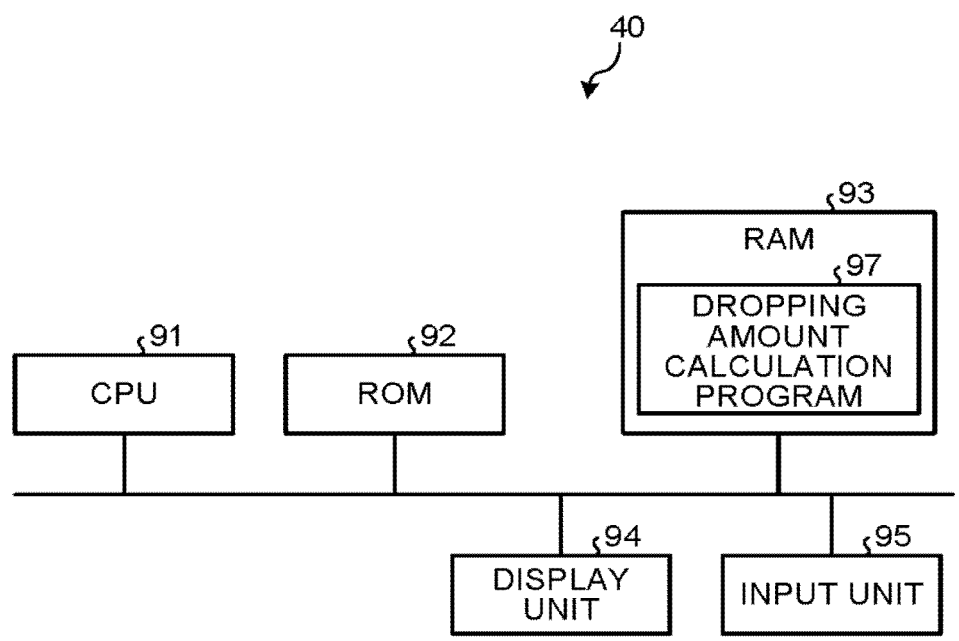
FIG. 9 is a diagram illustrating a hardware configuration of the resist dropping amount calculation device.

Next, description is made of the hardware configuration of the resist dropping amount calculation device 40. FIG. 9 is a diagram illustrating the hardware configuration of the resist dropping amount calculation device. The resist dropping amount calculation device 40 includes a CPU (Central Processing Unit) 91, a ROM (Read Only Memory) 92, a RAM (Random Access Memory) 93, a display unit 94, and an input unit 95. In the resist dropping amount calculation device 40, the CPU 91, the ROM 92, the RAM 93, the display unit 94, and the input unit 95 are connected through a bus line.

The CPU 91 determines the pattern using a dropping amount calculation program 97, which is a computer program. The dropping amount calculation program 97 is a computer program product with a nontransitory computer readable recording medium including a plurality of orders for calculating the dropping amount of resist 15A for each shot, which can be executed by the computer. The dropping amount calculation program 97 causes the computer to execute the plural orders to calculate the dropping amount.

The display unit 94 is a display device such as a liquid crystal monitor, and based on the instruction from the CPU 91, displays the shot map of the wafer 10, the topography, the step difference volume, the upper side volume, the resist volume, the resist dropping amount, and the like. The input unit 95 is formed by a mouse or a keyboard, and inputs the user's instruction information (such as parameters necessary for calculating the resist dropping amount) that is input from the outside. The instruction information input to the input unit 95 is sent to the CPU 91.

The dropping amount calculation program 97 is stored in the ROM 92 and loaded to the RAM 93 through the bus line. FIG. 9 illustrates the state in which the dropping amount calculation program 97 is loaded to the RAM 93.

The CPU 91 executes the dropping amount calculation program 97 loaded in the RAM 93. Specifically, in the resist dropping amount calculation device 40, the CPU 91 reads the dropping amount calculation program 97 out of the ROM 92, develops the program in a program storage region in the RAM 93, and executes various processes in accordance with the user's instruction input from the input unit 95. The CPU 91 temporarily stores data generated in these processes in a data storage region formed in the RAM 93.

The dropping amount calculation program 97 executed in the resist dropping amount calculation device 40 has the module configuration including the step difference volume calculation unit 42, the upper side volume calculation unit 43, and the dropping amount calculation unit 44, and these are loaded on the main memory device and these are generated on the main memory device.

In this embodiment, the wafer 10 is planarized, so that it becomes difficult to be affected by the step difference of the wafer 10 in the subsequent process to the wafer 10. For example, the pattern may be formed on the planarized wafer 10 through the imprinting process. In this imprinting process, the template is brought close to the wafer 10 to which the resist has been dropped. Through the capillary phenomenon, the resist on the wafer 10 fills the template pattern of the template. After that, the UV light is delivered to solidify the resist and then the template is released.

In this case, in a wafer 10X (not illustrated) with the large step difference (topography), the pressing of the template does not follow the shape of the wafer 10X near the step difference. In this case, the pattern defect occurs in the wafer 10X. On the other hand, in this embodiment, the topography of the wafer 10 is small, so that the pressing of the template follows the shape of the wafer 10. As a result, the pattern defect in the wafer 10 can be prevented.

If the topography of the wafer 10X is large, RLT, the thickness of the resist between the template and the wafer 10X varies. This causes the shearing force, which is required for horizontally moving the template, to vary in the template plane. As a result, the overlapping accuracy between the wafer 10X and the imprinting pattern is deteriorated. On the other hand, in this embodiment, the topography of the wafer 10 is small, so that the variation in shearing force in the template plane is small. Therefore, the overlapping accuracy between the wafer 10 and the imprinting pattern is improved.

Incidentally, there is a method in which an applied film is formed on the wafer 10X and with this applied film, the surface of the wafer 10X is planarized. In this method, the thickness of the applied film remains the same above and below the step difference with respect to the topography formed with a width in units of millimeters and a depth in units of nanometers. Therefore, the step difference according to the topography remains on the applied film. On the other hand, in the planarization method according to this embodiment, the step difference according to the topography can be solved with respect to the topography formed with a width in units of millimeters and a depth in units of nanometers.

As described above, in this embodiment, the resist 15A is dropped with the amount corresponding to the depth of the step difference on the surface of the wafer 10. Then, the resist 15A is pressed by the template 20, which is the blank template. After that, the resist 15B cured in the planarized state is etched back. Thus, the convex portion of the wafer 10 is removed together with the resist 15B. As a result, the surface of the wafer 10 with the large step difference amount is planarized.

According to the embodiment, the amount of resist 15A to be dropped onto the wafer 10 is adjusted for each shot of the wafer 10, whereby the surface of the wafer 10 can be planarized easily and highly accurately.

In this embodiment, the pressing plane of the template 21 is the pressing plane for a plurality of shots and one pressing process enables the pressing plane to be pressed against the plural shots. Thus, the surface of the wafer 10 can be planarized easily and highly accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate planarizing method comprising:
    dropping, from above a substrate with topography, resist whose amount is determined in accordance with a volume of a concave portion according to the topography of the substrate;
    moving a blank template with a flat pressing plane or the substrate so that a distance between the blank template and the substrate becomes a predetermined distance, the pressing plane of the blank template having a size more than or equal to a region including a plurality of shots of the substrate;
    pressing the pressing plane of the blank template against the resist, the pressing plane being pressed against the plurality of shots in one pressing process;
    curing the resist;
    releasing the blank template from the resist; and
    etching the substrate entirely from above the resist, etching selectivity between the resist and a film to be etched on the substrate in the entire etching being 1.5 or less, wherein
    an amount of resist to be dropped on the substrate is adjusted for each of the shots of the substrate, the amount of resist being calculated on the basis of the volume of the concave portion and a volume of upper side resist to be disposed above a convex and concave portion according to the topography, the volume of the upper side resist being calculated on the basis of an area of the pressing plane and a thickness of the upper side resist, and,
    a position where the resist is dropped is set in accordance with a position of the convex and concave portion according to the topography, and
    at least two kinds of resist dropping densities per unit area are set on the shot.

2. The substrate planarizing method according to claim 1, wherein,
    in the entire etching of the substrate,
    the resist is etched back until a part of a surface of the substrate is exposed so that the resist is embedded in only the concave portion of the substrate, and
    the resist is etched back further so that the resist is entirely removed.

3. A substrate planarizing method comprising:
    dropping, from above a substrate with topography, resist whose amount is determined in accordance with volume of a concave portion according to the topography of the substrate,
    moving a blank template with a flat pressing plane or the substrate so that a distance between the blank template and the substrate becomes a predetermined distance;
    pressing the pressing plane of the blank template against the resist;
    curing the resist;
    releasing the blank template from the resist; and
    etching the substrate entirely from above the resist, etching selectivity between the resist and a film to be etched on the substrate in the entire etching being 1.5 or less, wherein
    the pressing plane of the blank template has a size more than or equal to a region including a plurality of shots of the substrate,
    the pressing plane is pressed against the plurality of shots in one pressing process,
    an amount of resist to be dropped on the substrate is calculated on the basis of the volume of the concave portion and a volume of upper side resist to be disposed above a convex and concave portion according to the topography, the volume of the upper side resist being calculated on the basis of an area of the pressing plane and a thickness of the upper side resist, and,
    a position where the resist is dropped is set in accordance with a position of the convex and concave portion according to the topography, and
    at least two kinds of resist dropping densities per unit area are set on the shot.

4. The substrate planarizing method according to claim 3, wherein,
    in the entire etching of the substrate,
    the resist is etched back until a part of a surface of the substrate is exposed so that the resist is embedded in only the concave portion of the substrate, and
    the resist is etched back further so that the resist is entirely removed.

* * * * *